US012648149B2

(12) United States Patent
Chen et al.

(10) Patent No.: US 12,648,149 B2
(45) Date of Patent: Jun. 2, 2026

(54) TRENCH-TYPE BEOL MEMORY CELL

(71) Applicant: Taiwan Semiconductor Manufacturing Company, Ltd., Hsinchu (TW)

(72) Inventors: Tzu-Yu Chen, Kaohsiung City (TW); Sheng-Hung Shih, Hsinchu City (TW); Kuo-Chi Tu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1067 days.

(21) Appl. No.: 17/672,382

(22) Filed: Feb. 15, 2022

(65) Prior Publication Data

US 2023/0157030 A1 May 18, 2023

Related U.S. Application Data

(60) Provisional application No. 63/280,285, filed on Nov. 17, 2021.

(51) Int. Cl.
*H10B 53/30* (2023.01)

(52) U.S. Cl.
CPC ................................... *H10B 53/30* (2023.02)

(58) Field of Classification Search
CPC ...................................................... H10B 53/30
See application file for complete search history.

(56) References Cited

U.S. PATENT DOCUMENTS

| | | | |
|---|---|---|---|
| 6,630,380 B1 | 10/2003 | Cheng et al. | |
| 9,172,036 B2 | 10/2015 | Chen et al. | |
| 10,164,184 B2 | 12/2018 | Sung et al. | |
| 11,088,203 B2 * | 8/2021 | Hsieh | ................ H10N 70/8833 |
| 2005/0167725 A1 | 8/2005 | Nagano et al. | |
| 2005/0170599 A1 | 8/2005 | Joo | |
| 2011/0147692 A1 | 6/2011 | Park et al. | |
| 2019/0267544 A1 | 8/2019 | Wang et al. | |
| 2021/0035992 A1 * | 2/2021 | Chen | ..................... H10B 53/10 |
| 2021/0272972 A1 | 9/2021 | Young et al. | |

FOREIGN PATENT DOCUMENTS

| | | |
|---|---|---|
| CN | 1649157 A | 8/2005 |
| CN | 102104055 A | 6/2011 |
| JP | H1079478 A | 3/1998 |
| JP | 2004282041 A | 10/2004 |
| JP | 2011066145 A | 3/2011 |

* cited by examiner

*Primary Examiner* — Richard A Booth
(74) *Attorney, Agent, or Firm* — Eschweiler & Potashnik, LLC

(57) ABSTRACT

An integrated chip includes a memory cell within a BEOL metal interconnect. The memory cell may be an FeRAM memory cell. The memory cell is formed over a plurality of openings in a dielectric structure that includes an inter-level dielectric layer. The openings may be form an array or another two-dimensional pattern. The layers of the memory cell line the openings whereby each of a lower electrode layer, a data storage layer, and an upper electrode descend into the openings. The lower electrode layer may pass through an etch stop layer and contact a lower interconnect. There may be a plurality of top electrode vias. The top electrode vias may be offset from the opening. This memory cell structure provides a large area, which leads to low threshold voltages.

20 Claims, 17 Drawing Sheets

800

101

111

Mx

121

137

139

123

143

141

Mx-1

155

1100

1200

2000

| | |
|---|---|
| Form a lower interconnect within a lower dielectric structure over a substrate | 2002 |
| Form a dielectric structure including a first inter-level dielectric layer over the lower dielectric structure | 2004 |
| Pattern the dielectric structure to form a two-dimensional pattern of openings | 2006 |
| Form a memory cell stack over the dielectric structure and within the openings | 2008 |
| Form a capping structure over the memory cell stack | 2010 |
| Pattern the memory cell stack to define memory cells | 2012 |
| Form sidewall spacers | 2014 |
| Form a second inter-level dielectric layer over the memory cell | 2016 |
| Form top electrode vias | 2018 |

Fig. 20

TRENCH-TYPE BEOL MEMORY CELL

REFERENCE TO RELATED APPLICATION

This application claims the benefit of U.S. Provisional Application No. 63/280,285, filed on Nov. 17, 2021, the contents of which are incorporated herein by reference in their entirety.

BACKGROUND

Many modern-day electronic devices contain electronic memory. Electronic memory may be volatile or non-volatile. Non-volatile memory retains stored data in the absence of power whereas volatile memory does not. Dynamic random-access memory (DRAM) that requires frequent refresh is volatile memory. Non-volatile memory includes, for example, resistive random-access memory (RRAM), magnetoresistive random-access memory (MRAM), ferroelectric random-access memory (FeRAM), phase-change memory (PCM), and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20 provides a flow chart illustrating a method of forming an integrated chip including a memory cell according to the present disclosure.

DETAILED DESCRIPTION

Figure 1:
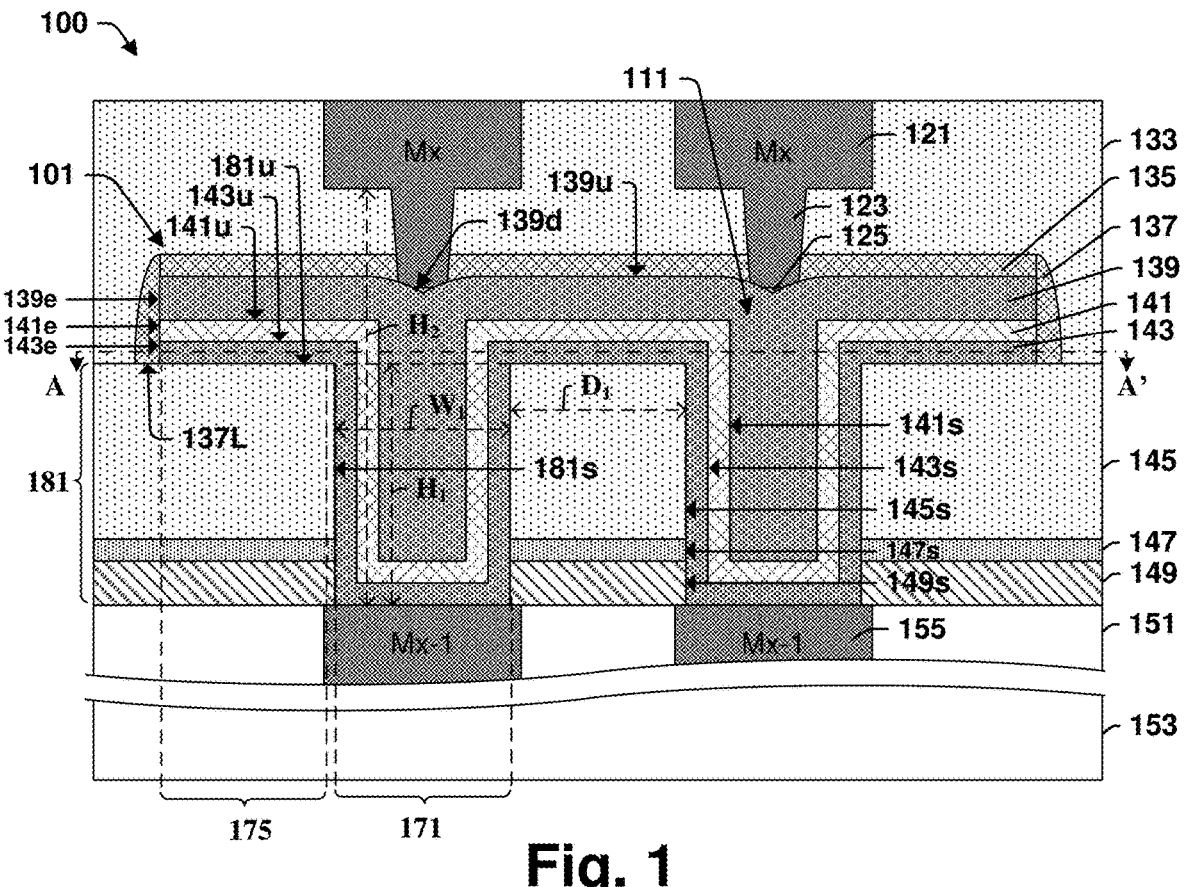
FIG. 1 illustrates a cross-sectional side view of an integrated chip having a memory cell in accordance with some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to memory cells that are disposed within a back-end-of line (BEOL) metal interconnect of an integrated chip. The BEOL metal interconnect includes a plurality of via layers and metallization layer that provide interconnects within dielectric structures. A first dielectric structure comprising an inter-level dielectric (ILD) layer is disposed over one of the metallization layers within the metal interconnect. In some embodiments, the first dielectric structure comprises an etch stop layer. In some embodiments, the first dielectric structure comprises a buffer layer between the etch stop layer and the ILD layer. The first dielectric structure comprises inner sidewalls that define one or more openings through the first dielectric structure. A memory cell comprising a lower electrode, a data storage layer, and an upper electrode is disposed over the one or more openings whereby a first portion of the memory cell is lateral to the one or more opening and a second portion of the memory cell is disposed within the one or more openings. Each of the first portion and the second portion comprise portions of the lower electrode, the data storage layer, and the upper electrode.

In some embodiments, the one or more openings comprises a plurality of openings. In some embodiments, the plurality of opening form a two-dimensional arrangement. In some embodiments, the memory cell lacks a lower electrode via whereby the lower electrode directly contacts an interconnect that includes one or more wires in the metallization immediately under the memory cell.

The memory cell may be of a non-volatile type. In some embodiments, the memory cell is resistive random-access memory (RRAM), magnetoresistive random-access memory (MRAM), ferroelectric random-access memory (FeRAM), phase-change memory (PCM), or the like. The data storage layer may include a plurality of layers and its composition depends on the memory type. In some embodiments the memory cell is ferroelectric random access memory (FeRAM) cell and the data storage layer is a ferroelectric.

A memory cell according to the present teachings has a large effective cell area. The large effective cell area makes threshold voltages more predictable and reduces cell-to-cell variations in threshold voltage. The large area also reduces edge effects, which allows an area around the edge of the memory cell to have a simple structure that does not waste chip area and minimizes a number of processing steps. The effective cell area is made greater by making the openings deeper. In some embodiments, a depth of the one or more openings is greater than a width of each of the openings. The openings are made deep by forming them in the first dielectric structure which includes the ILD layer. In some embodiments, the dielectric structure occupies a majority of space between adjacent metallization layers. The openings may be further increase by extending them into an etch stop layer beneath the ILD layer. In some embodiments, the lower electrode directly contacts the underlying metallization layer and does not have a lower electrode via. In some embodiments a depth of the openings is half or more a distance from the underlying metallization layer to a metallization layer immediately above the memory cell. In some embodiments the lower electrode contacts a plurality of wires in the underlying metallization layer.

The effective cell area may be further increased by forming the memory cell over a plurality of openings. Forming the memory cell over a plurality of openings provides additional benefits. When the memory cell is formed over a single opening, the upper electrode may have a depression over the opening. A capping or hard mask layer trapped in the depression may interfere with contact by a top electrode via. When there are several openings, each depression is smaller making it easier to land the top electrode via on the upper electrode with good contact. In some embodiments, the memory cell includes a plurality of top electrode vias. Having a plurality of top electrode vias reduces resistance. In some embodiments, the top electrode vias are laterally offset from the openings. In some embodiments, the number of top electrode vias is distinct from the number of openings. Being able to decouple the number and location of top electrode vias from the number and location of openings provides flexibility in design and manufacturing.

In a method of the present disclosure, the first dielectric structure is formed over a metallization layer. A mask is formed and used to etch the one or more openings through the first dielectric structure. A memory cell stack is formed over the openings in such a way that the lower electrode and the data storage layer line the openings. In some embodiments, these layers are formed by atomic layer deposition. In some embodiments, the upper electrode is also formed by atomic layer deposition. The the memory cell stack is then etched to define the memory cell from the memory cell stack. In some embodiments, a sidewall spacer is formed around the memory cell. In some embodiments, the sidewall spacer contacts edges of the lower electrode, the data storage layer, and the upper electrode. The sidewall spacer may be above the dielectric structure.

FIG. 1 illustrates a cross-sectional view of an integrated chip 100 having a memory cell according to some embodiments of the present teachings. The integrated chip 100 comprises a lower interconnect 155 disposed within a lower dielectric structure 151 over a substrate 153. A dielectric structure 181 comprising an etch stop layer 149, a buffer layer 147, and a first ILD layer 145 is disposed over the lower dielectric structure 151. The dielectric structure 181 comprises inner sidewalls 181s that define openings 111 through the dielectric structure 181. The inner sidewalls 181s comprise inner sidewalls 149s of the etch stop layer 149, inner sidewalls 147s of the buffer layer 147, and inner sidewalls 145s of the first ILD layer 145.

A memory cell 101 is arranged over the dielectric structure 181 and extends through the openings 111 to electrically couple with the lower interconnect 155. The memory cell 101 comprises a data storage layer 141 disposed between a lower electrode 143 and an upper electrode 139. In an area 175 that is lateral to the openings 111, each of the lower electrode 143, the data storage layer 141, and the upper electrode 139 of the memory cell 101 are over the dielectric structure 181 and extend generally horizontally. In the area 175, the data storage layer 141 is disposed vertically between the lower electrode 143 and the upper electrode 139. In an area 171, each of the lower electrode 143, the data storage layer 141, and the upper electrode 139 extends into the openings 111 in a generally vertical direction. In the area 171, the data storage layer 141 is generally disposed laterally between the lower electrode 143 and the upper electrode 139. The lower electrode 143 is arranged along upper surfaces 181u and the inner sidewalls 181s of the dielectric structure 181. The data storage layer 141 is arranged along upper surfaces 143u and the inner sidewalls 143s of the lower electrode 143. The upper electrode 139 is arranged along upper surfaces 141u and the inner sidewalls 141s of the data storage layer 141. Each of the upper electrode 139, the data storage layer 141, and the lower electrode 143 descend into the openings 111.

In some embodiments, a capping structure 135 comprising a dielectric material is arranged over the upper electrode 139. Top electrode vias 123 extends through the capping structure 135 to couple the upper electrode 139 with an upper interconnect 121 that is disposed within an upper dielectric structure 133. The top electrode vias 123 contact an upper surface 139u of the upper electrode 139. In some embodiments, the upper surface 139u has depressions 139d above the openings 111. In some embodiments, at least one of the top electrode vias 123 is directly over one of the depressions 139d. In some of these embodiments, an island 125 of dielectric material from the capping structure 135 is trapped between the top electrode via 123 and the upper electrode 139 within the depression 139d.

A sidewall spacer 137 surrounds the memory cell 101. In some embodiments, the sidewall spacer 137 contacts an edge 139e of the upper electrode 139, an edge 141e of the data storage layer 141, and an edge 143e of the lower electrode 143. In some embodiments the edge 139e, the edge 141e, and the edge 143e are aligned. In some embodiments, a lower surface 137L of the sidewall spacer 137 is completely confined above the upper surface 181u of the dielectric structure 181.

Figure 2:
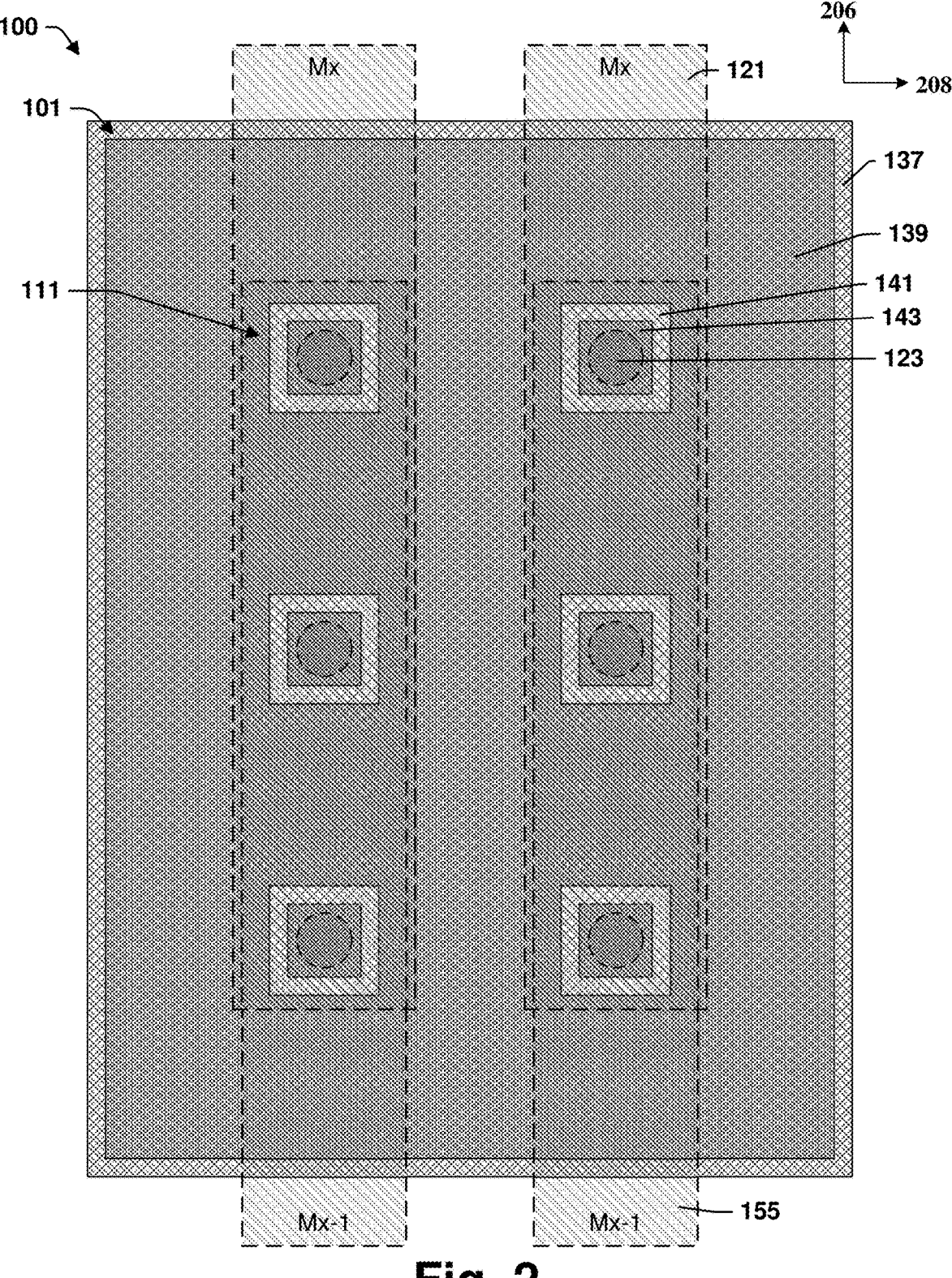
FIG. 2 illustrates a top view of the integrated chip of FIG. 1.

FIG. 2 provides a top-view of the integrated chip 100 of FIG. 1, taken along cross-sectional line A-A' of FIG. 1. As shown by FIG. 2, the memory cell 101 may have a substantially square or rectangular shape that extends a first distance along a first direction 206 and a second distance along a second direction 208, which is perpendicular to the first direction 206. The second distance can be greater than, equal to, or less than the first distance. Alternatively, the integrated chip 100 may have a circular shape, an oval shape, a hexagonal shape, or any other shape.

Figure 3:
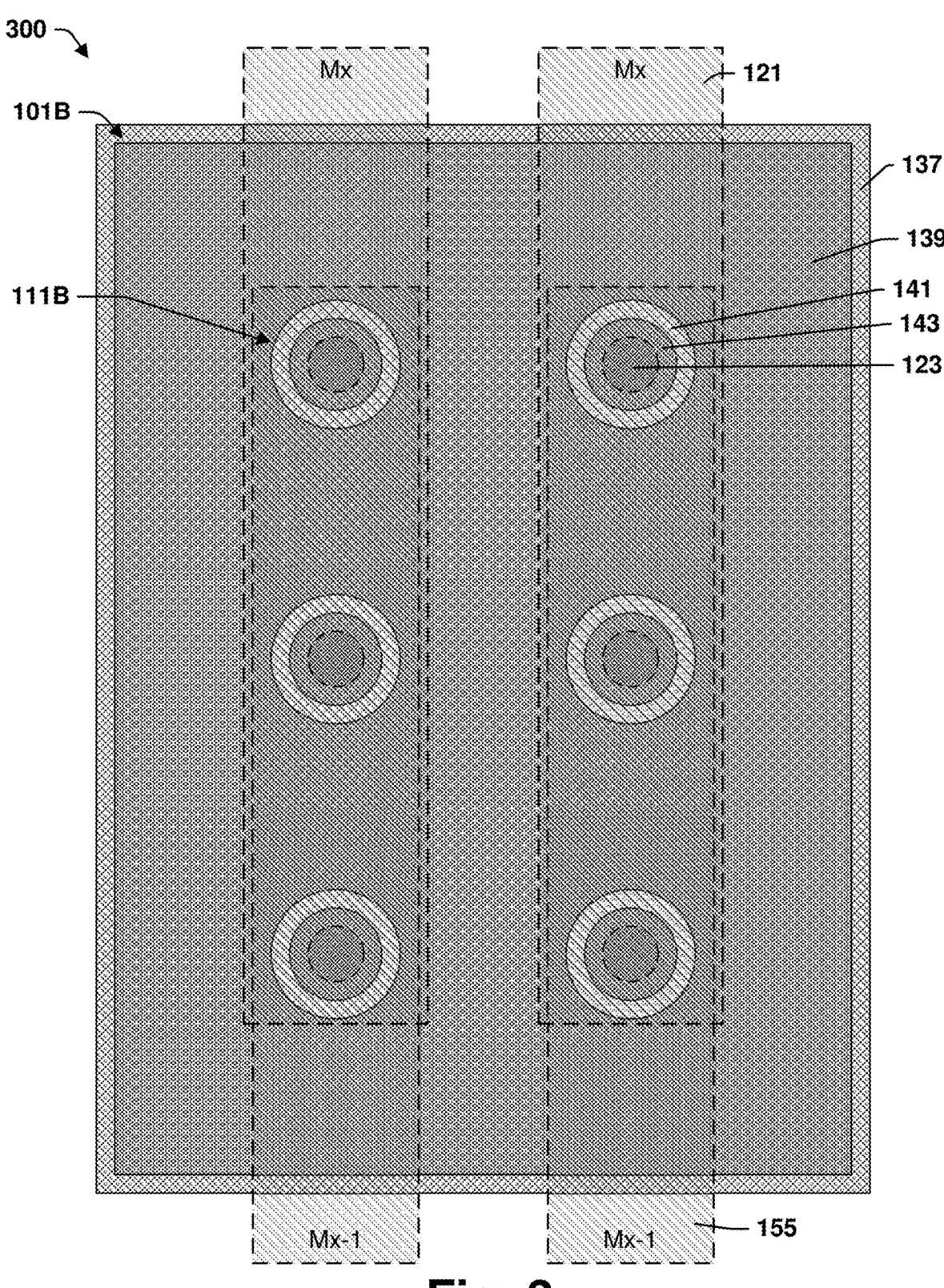
FIGS. 3-9 illustrate top views of integrated chips having memory cells according to various embodiments of the present disclosure.

The openings 111, which are bounded by the inner sidewalls 181s of the dielectric structure 181, also have a substantially square or rectangular shape. The openings 111 may extend a third distance along the first direction 206 and fourth distance along the second direction 208. The fourth distance may be greater than, less than, or equal to the third distance. Alternatively, the openings 111 may have circular shapes, oval shapes, hexagonal shapes, or any other shapes. FIG. 3 provide a top view 300 of an integrated chip having a memory cell 101B according to an alternate embodiment. The memory cell 101B is like the memory cell 101 but has openings 111B that are circular.

In some embodiments, the openings 111 may have an oblong shape (e.g., rectangular or oval), but have a maximum width three times or less a minimum width. In some embodiments, the maximum width is twice of less a minimum width. Opening shapes that are less oblong such as those that are nearly square, circular, or hexagonal provide a high surface area.

The openings 111 are distributed in two dimensions meaning they are not all in a single line. As shown in this example, the openings 111 may be arranged in an array. The openings 111 may be aligned in rows (extending in the second direction 208) and columns (extending in the first direction 206). The array may be 2×2, 2×4, 2×6, 3×3 or some other size. In the present example, the array is 2×6. The memory cell 101 may itself be one in an array of like memory cells 101 forming a memory cell block.

Two wires in a metallization layer Mx-1 of the lower interconnect 155 are positioned so as to be directly underneath each of the columns. Each of the wires couples with the lower electrode 143 through each of a plurality of opening that are in the corresponding column. Alternatively, a single wider wire of the lower interconnect 155 may extend so as to be directly under each one of the openings 111 in the array and couple with the lower electrode 143 through every one of the openings 111. Another alternative is to have the wires extend in the second direction 208 along the rows, in which case three wires may be employed. In some embodiments, the lower electrode 143 makes direct contact with one of the wires at the base of each opening.

As shown in FIG. 2, there may be one top electrode via 123 for each of the openings 111. Alternatively, there may be a greater or lesser number of top electrode vias 123. As shown in FIG. 2, the top electrode vias 123 may be directly over the openings 111. Alternatively, some or all of the top electrode vias 123 may be laterally offset from the openings 111.

In some embodiments, the top electrode vias 123 are distributed in two dimensions meaning there are at least three and they are not all in a single line. As shown in this example, the top electrode vias 123 may be distributed in an array. The top electrode vias 123 may be aligned in rows (extending in the second direction 208) and columns (extending in the first direction 206). The array may be 2×2, 2×4, 2×6, 3×3 or some other size. In the present example, the array is 2×6. Alternatively, the vias may be distributed unevenly over the upper electrode 139.

Two wires in a metallization layer Mx of the upper interconnect 121 are positioned so as to be directly over each of the columns. Each of the wires couples with the top electrode vias 123 in the corresponding column. Alternatively, a single wider wire of the upper interconnect 121 may extend so as to be directly over each one of top electrode vias 123. Another alternative is to have the wires extend in the second direction 208 along the rows, in which case three wires may be employed. Each of the top electrode vias 123 makes direct contact with one of the wires.

Figure 4:
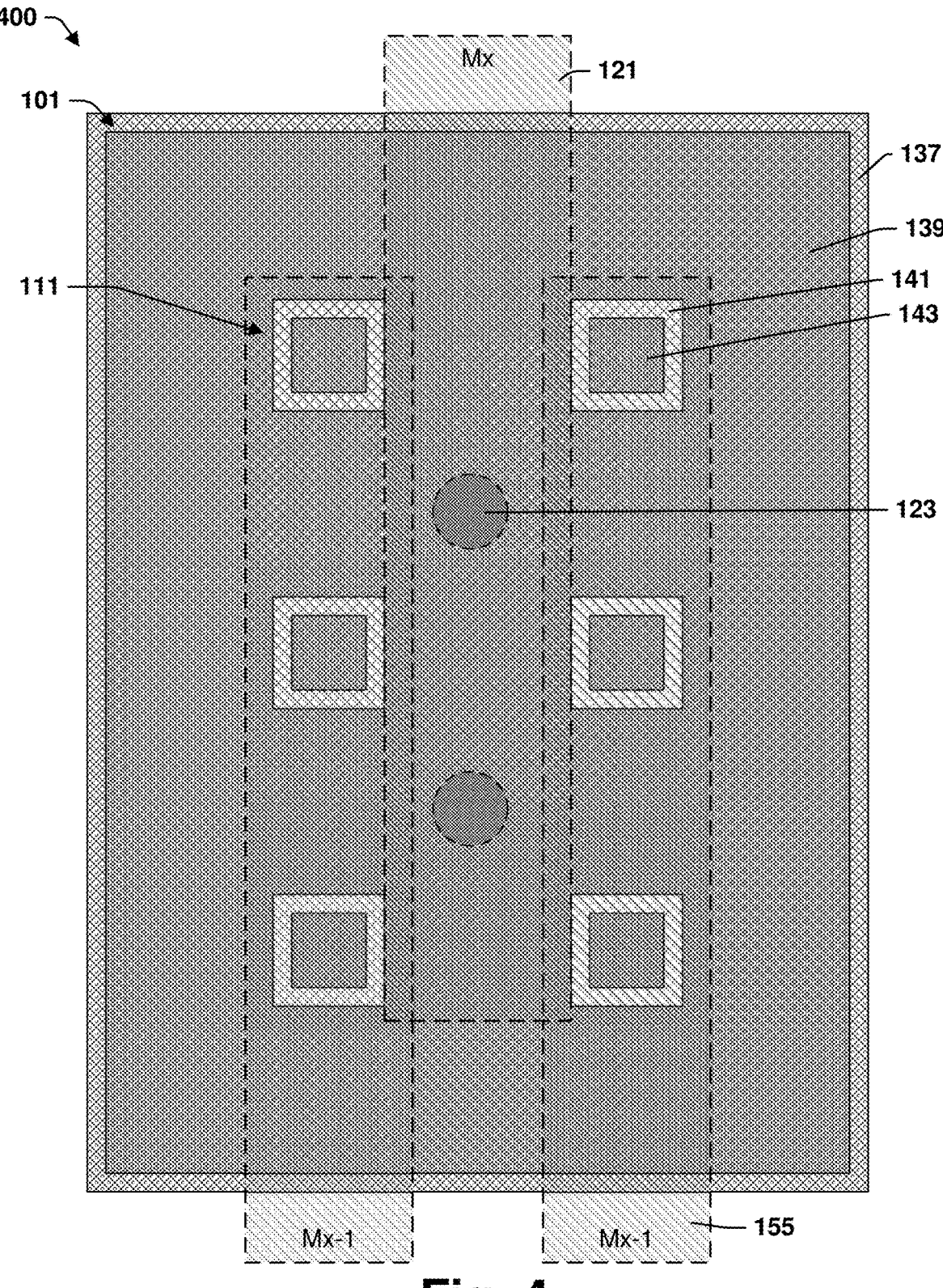

FIG. 4 provides a top view 400 for an alternate embodiment of an integrated chip according to the present teachings. The integrated chip of FIG. 4 is like the integrated chip 100 of FIGS. 1 and 2 but has only two top electrode vias 123, both of which contact a single wire of the upper interconnect 121. In this embodiment, the top electrode vias 123 are offset from the openings 111, which may help ensure good contact with the upper electrode 139.

Figure 5:
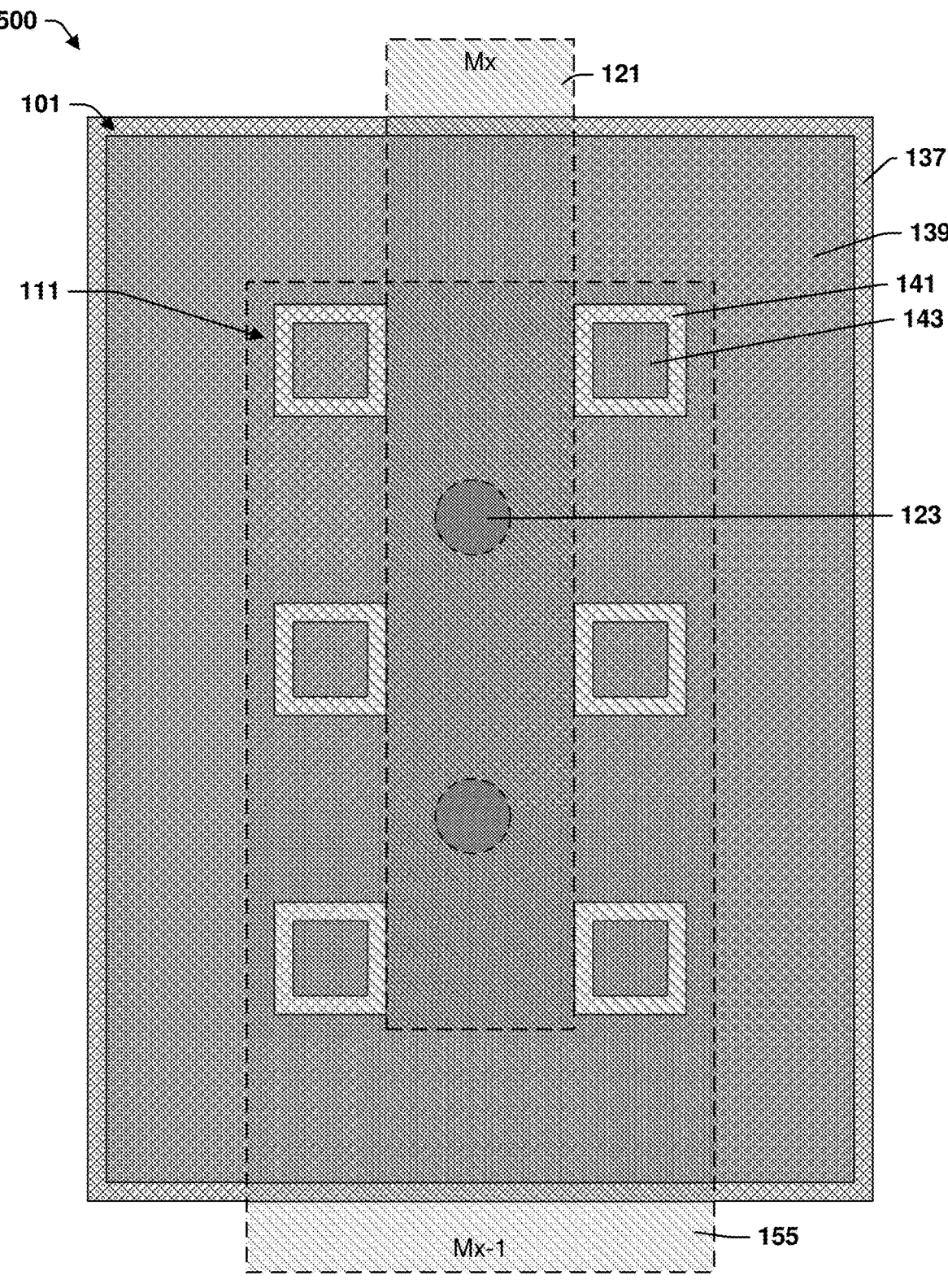

FIG. 5 provides a top view 500 for another alternate embodiment of an integrated chip according to the present teachings. The integrated chip of FIG. 5 is like the integrated chip of FIG. 4, except that in the integrated chip of FIG. 5 the lower interconnect 155 includes a single broad wire that extends underneath all six of the openings 111 in the dielectric structure 181 corresponding to the memory cell 101. The lower electrode 143 contacts the wire at the base of each opening 111.

Figure 6:
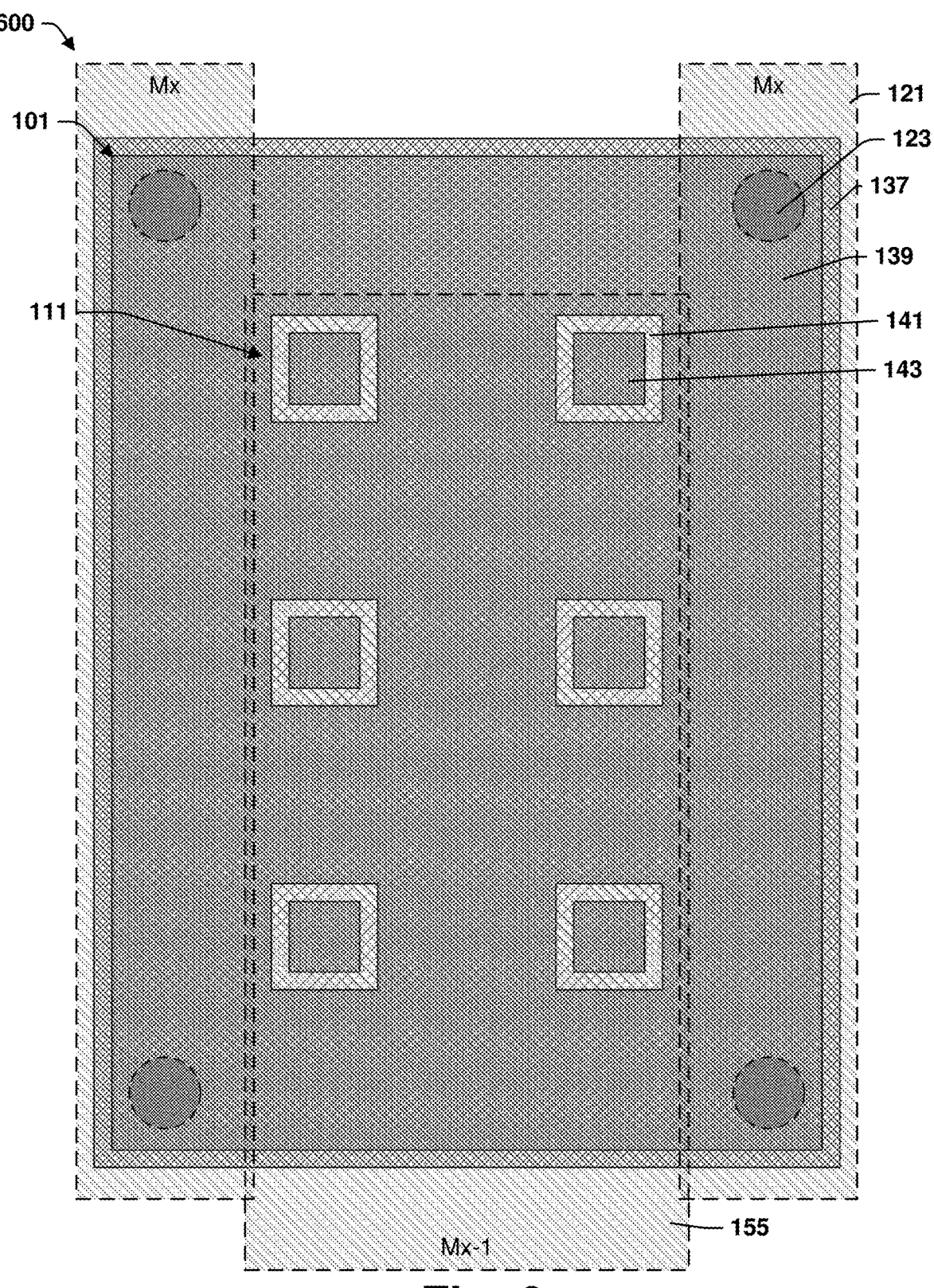

FIG. 6 provides a top view 600 for another alternate embodiment of an integrated chip according to the present teachings. The integrated chip of FIG. 6 is like the integrated chip of FIG. 5, except that in the integrated chip of FIG. 6 there are four top electrode vias 123 located near the outer corners of the memory cell 101. The upper interconnect 121 includes two wires that contact these four top electrode vias 123.

Figure 7:
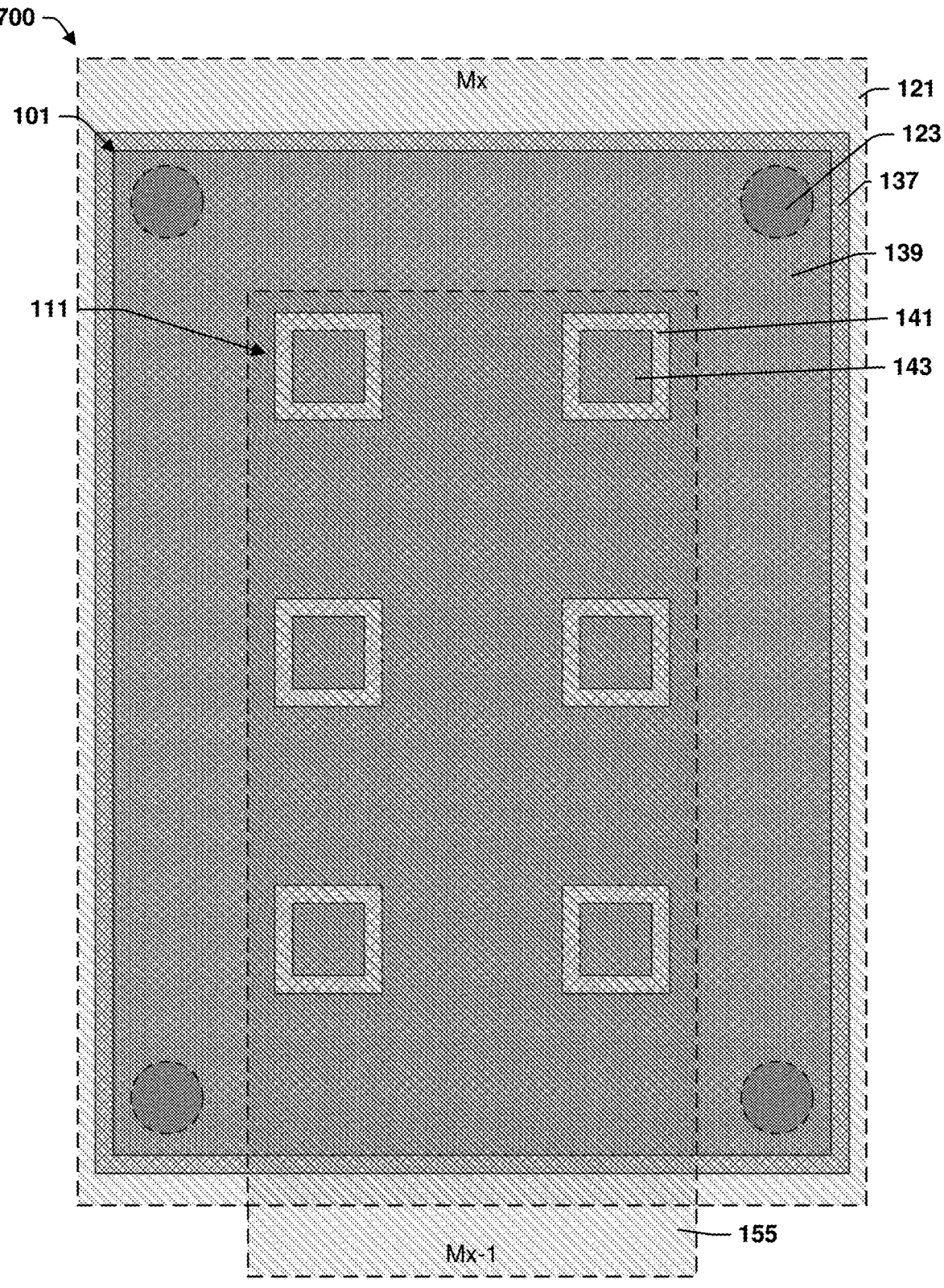

FIG. 7 provides a top view 700 for another alternate embodiment of an integrated chip according to the present teachings. The integrated chip of FIG. 7 is like the integrated chip of FIG. 6, except that in the integrated chip of FIG. 7 the upper interconnect 121 includes single broad wire that contact all four of the top electrode vias 123.

Figure 8:
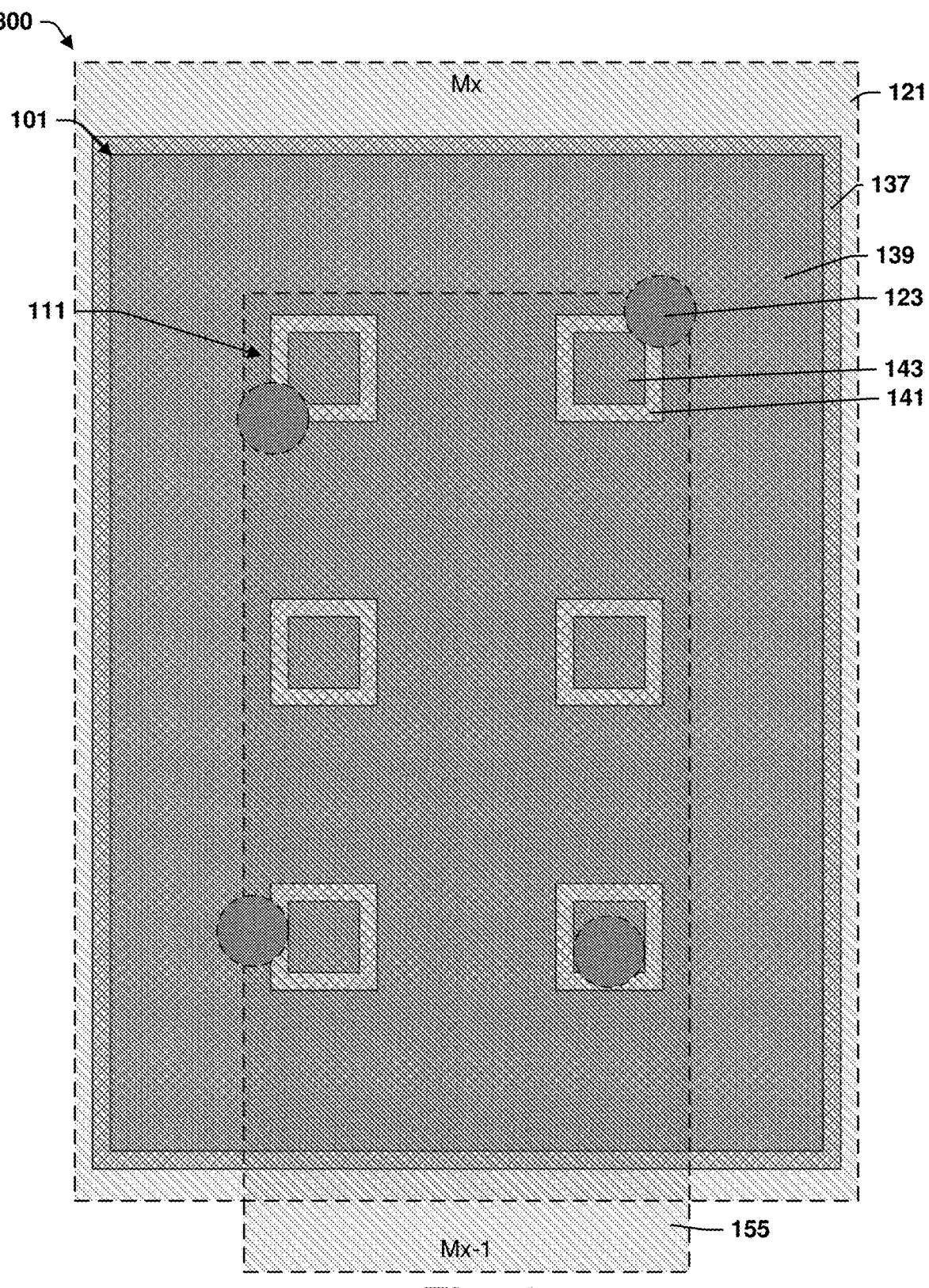

FIG. 8 provides a top view 800 for another alternate embodiment of an integrated chip according to the present teachings. The integrated chip of FIG. 8 is like the integrated chip of FIG. 8, except that in the integrated chip of FIG. 7 the top electrode vias 123 are irregularly distributed over the upper electrode 139. This embodiment illustrates the flexibility in locating the top electrode vias 123 provided by a memory cell 101 that is formed over many small openings.

Figure 9:
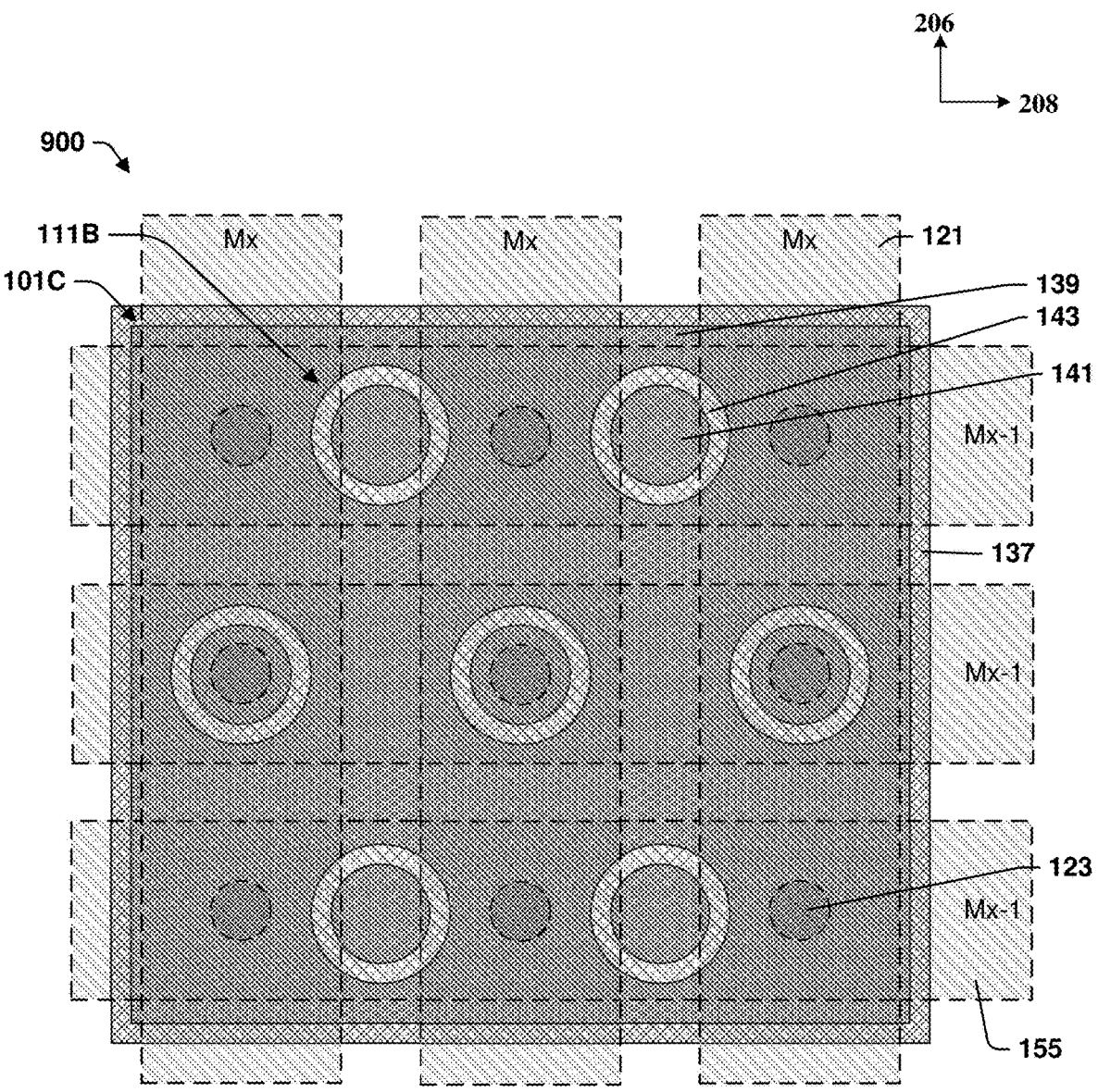

FIG. 9 provides a top view 900 of an integrated chip according to some other embodiments of the present teachings. The integrated chip includes a memory cell 101C that is like the memory cell 101B but contains seven openings 111B. The seven openings 111B are organized in three rows. The openings 111B in each row are staggered with respect to the openings 111B in the adjacent row. There are nine top electrode vias 123 arranged in a 3×3 array. In this embodiment, the lower interconnect 155 includes three wires extending in the second direction 208 to contact the lower electrode 143 at the base of each of the seven openings 111B. The upper interconnect 121 includes three wires extending in the first direction 206. Each of the wires in the metallization layer Mx contacts three of the top electrode vias 123.

With reference to FIGS. 1 and 2, the openings 111 have a width $W_1$ and a height $H_1$. In some embodiments, the height $H_1$ is greater than or equal to the width $W_1$. In some embodiments, the height $H_1$ is twice or more the width $W_1$. A height $H_2$ separates the lower interconnect 155 from the upper interconnect 121. The height $H_2$ is also a distance between the metallization layer Mx-1 that is immediately beneath the memory cell 101 and the metallization layer Mx immediately that is immediately above the memory cell 101. In some embodiments, the height $H_1$ is half or more the height $H_2$. In some embodiments, the height $H_1$ is from about 400 Angstroms (Å) to about 3200 Å. In some embodiments, the height $H_1$ is from about 700 Å to about 2150 Å. In some embodiments, a distance $D_1$ between adjacent openings 111 is less than or equal to a width $W_1$ of the openings 111. In some embodiments, this limitation is met in both the first direction 206 and the second direction 208.

The integrated chip 100 may comprise one or more lower interconnects 155 disposed within the lower dielectric structure 151 and one or more upper interconnects 121 disposed within the upper dielectric structure 133. The lower interconnects 155 and the upper interconnects 121 may comprise interconnect wires, interconnect vias, contact plugs, contact pads, or the like. In some embodiments, the lower interconnects 155 and the upper interconnects 121 comprise copper, tungsten, ruthenium, aluminum, a combination thereof, or the like. Each of the lower dielectric structure 151 and the upper dielectric structure 133 may comprise a plurality of stacked inter-level dielectric (ILD) layers. The ILD layers may be separated by one or more etch stop layers and buffer layers.

The first ILD layer 145 and other ILD layers may comprise silicon dioxide, carbon doped silicon dioxide, borosilicate glass (BSG), phosphorus silicate glass (PSG), borophosphosilicate glass (BPSG), fluorosilicate glass (FSG), un-doped silicate glass (USG), a combination thereof, or the like. In some embodiments, the first ILD layer 145 is a low-κ dielectric. In some embodiments, the first ILD layer 145 is an extremely low-κ dielectric. An extremely low-κ dielectric may be a low-κ dielectric material with porosity that reduces the overall dielectric constant. In some embodiments, the first ILD layer 145, with specific reference to that portion of the first ILD layer 145 up to the height $H_1$ of the openings 111, is from about 300 to about 2000 Å thick. In some embodiments, that portion of the first ILD layer 145 is from about 500 to about 1500 Å thick.

The etch stop layer 149 and other etch stop layers may comprise metal nitride, metal oxide, metal carbide, silicon nitride, silicon oxide, silicon carbide, silicon oxynitride, silicon oxycarbide, a combination thereof, or the like. In some embodiments, the etch stop layer 149 comprises silicon carbide, silicon nitride, silicon oxynitride, silicon oxycarbide, a combination thereof, or the like. In some embodiments, the etch stop layer 149 comprises silicon carbide or the like. In some embodiments, the etch stop layer 149 is from about 50 to about 500 Å thick. In some embodiments, the etch stop layer 149 is from about 150 to about 350 Å thick.

The buffer layer 147 is optional but may be included, for example, to promote adhesion between the first ILD layer 145 and the etch stop layer 149. The buffer layer 147 may be, for example, a silicon oxide compound such as silicon dioxide, silicon rich oxide, or the like. In some embodiments, the buffer layer 147 is a silicon oxide derived from tetraethyl orthosilicate (TEOS). In some embodiments, the etch stop layer 149 is from about 30 to about 700 Å thick. In some embodiments, the etch stop layer 149 is from about 50 to about 300 Å thick.

Each of the lower electrode 143 and the upper electrode 139 may be or comprise one or more layers of metals such as tantalum nitride, titanium nitride, ruthenium, platinum, iridium, tungsten, combinations thereof, or the like. In some embodiments, the lower electrode 143 is or comprises tantalum nitride, titanium nitride, a one layer of each, or the like. In some embodiments, the lower electrode 143 has a thickness in the range from about 25 Å to about 400 Å. In some embodiments, the lower electrode 143 has a thickness in the range from about 50 Å to about 200 Å. In some embodiment, the lower electrode 143 forms a layer having these thickness. In some embodiments, these thicknesses apply to the area 175 that is lateral to the openings 111.

In some embodiments, the upper electrode 139 is or comprises tantalum nitride, titanium nitride, a one layer of each, or the like. In some embodiments, the upper electrode 139 has a thickness in the range from about 25 Å to about 1000 Å. In some embodiments, the upper electrode 139 has a thickness in the range from about 50 Å to about 500 Å. These thicknesses apply to the area 175 that is lateral to the openings 111. Within the openings 111 the upper electrode 139 may be thicker due to deposition on or growth from opposing inner sidewalls 141s of the data storage layer 141.

The data storage layer 141 may include one or more layers of any suitable materials. In some embodiments, the data storage layer 141 comprises a ferroelectric layer. The ferroelectric layer may be, for example, a binary oxide, a ternary oxide, or a quaternary oxide. In some embodiments the data storage layer 141 is a ternary oxide such as hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitrate (AlScN), aluminum gallium nitride (AlGaN), aluminum yttrium nitrate, a combinations thereof, or the like. In some embodiments the data storage layer 141 is a quaternary oxide such as barium strontium titanate ($BaSrTiO_x$) or the like. In some embodiments, the data storage layer 141 has a thickness in the range from about 25 Å to about 400 Å. In some embodiments, the data storage layer 141 has a thickness in the range from about 50 Å to about 200 Å.

The capping structure 135 may include one or more layers of any suitable materials. In some embodiments, the capping structure 135 comprises a hard mask material. The hard mask material may be, for example, silicon oxynitride, titanium nitride, silicon oxide, silicon nitride, silicon carbide nitride, silicon oxide nitride, a metal oxide, a combination thereof, or the like. The metal oxide may be titanium oxide, aluminum oxide, or the like. In some embodiments, the capping structure 135 has a thickness in the range from about 30 Å to about 600 Å. In some embodiments, the capping structure 135 has a thickness in the range from about 50 Å to about 400 Å. Materials that are suitable for the capping structure may also be suitable for the sidewall spacer 137.

Figure 10:
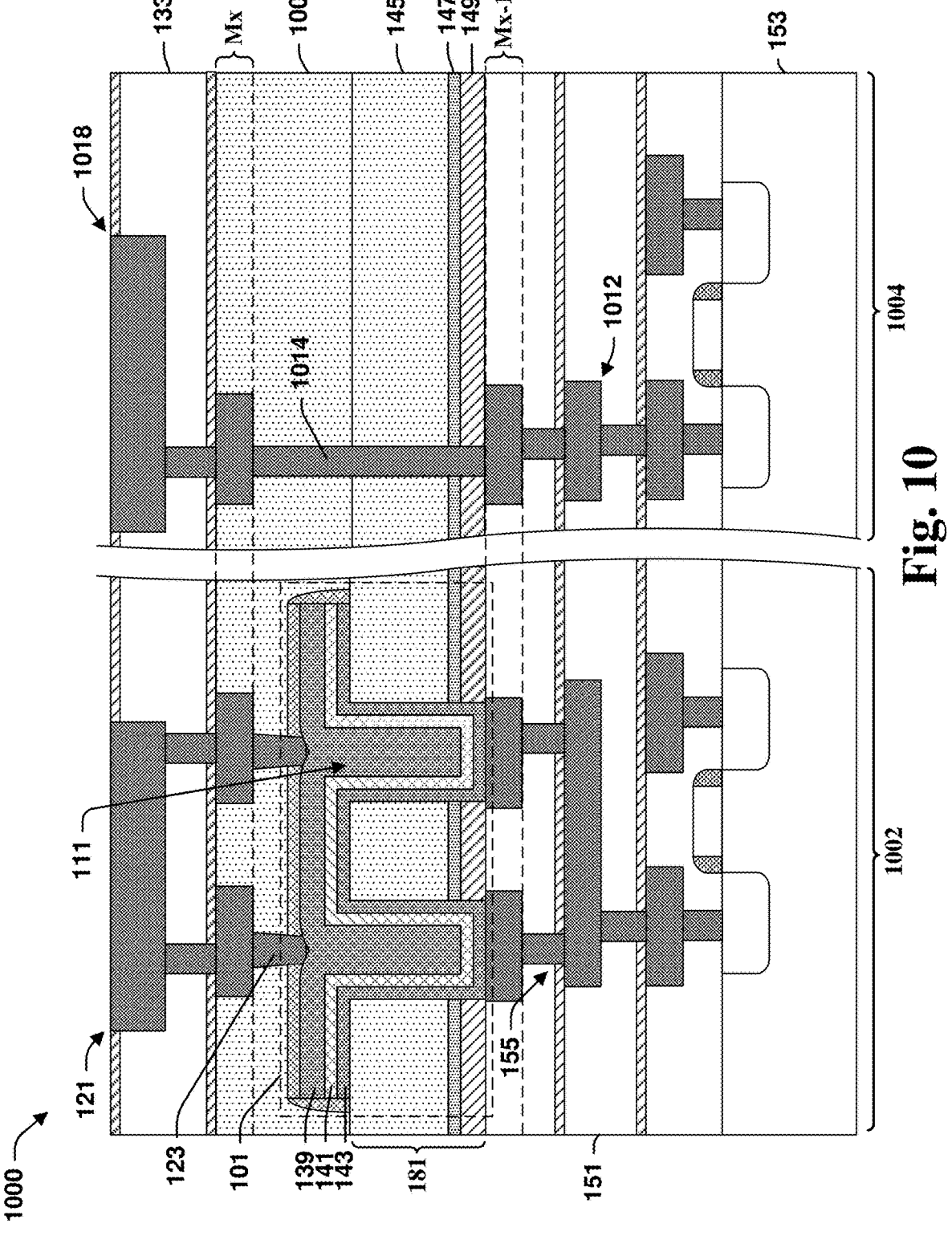
FIG. 10 illustrates a cross-sectional side view of an integrated chip having a memory cell in accordance with some other embodiments of the present disclosure.

FIG. 10 illustrates a cross-sectional view 1000 of some embodiments of an integrated chip having a memory cell 101. The integrated chip comprises a first region 1002—which may also be referred to as a memory region—and a second region 1004 which is laterally offset from the first region 1002 and may be referred to as a logic region. Within the first region 1002, one or more lower interconnects 155 are arranged within the lower dielectric structure 151 over the substrate 153. The memory cell 101 is arranged over the dielectric structure 181, which is itself above the lower dielectric structure 151. The dielectric structure 181 comprises the etch stop layer 149, the buffer layer 147, and the first ILD layer 145. The first ILD layer 145 may be continuous with a second ILD layer 1006 that is disposed to the sides of and over the memory cell 101. The second ILD layer 1006 is the lowermost portion of the upper dielectric structure 133. An upper interconnect 121 is arranged within the upper dielectric structure 133. The upper interconnect 121 is electrically coupled to the memory cell 101 by top electrode vias 123.

The memory cell 101 includes a lower electrode 143 and an upper electrode 139 separated from one another by data storage layer 141. The lower electrode 143, the upper electrode 139, and the data storage layer 141 each comprises downward protrusions that extend into the openings 111 in the dielectric structure 181. The lower electrode 143 extends downward to contact the one or more lower interconnects 155.

Within the second region 1004, one or more additional lower interconnects 1012 are disposed within the lower dielectric structure 151. The one or more additional lower interconnects 1012 are coupled to an additional interconnect via 1014 passing through the dielectric structure 181 and the second ILD layer 1006. An additional upper interconnect 1018 is disposed within the upper dielectric structure 133. The upper interconnect 121 and the additional upper interconnect 1018 each comprise wires in the metallization layer Mx. The lower interconnect 155 and the additional lower interconnect 1012 each comprise wires in the metallization layer Mx-1.

FIGS. 11-19 illustrate cross-sectional views of some embodiments of a method of forming an integrated chip having a memory cell. Although FIGS. 11-19 are described in relation to a method, it will be appreciated that the structures disclosed in FIGS. 11-19 are not limited to such a method, but instead may stand alone as structures independent of the method.

Figure 11:
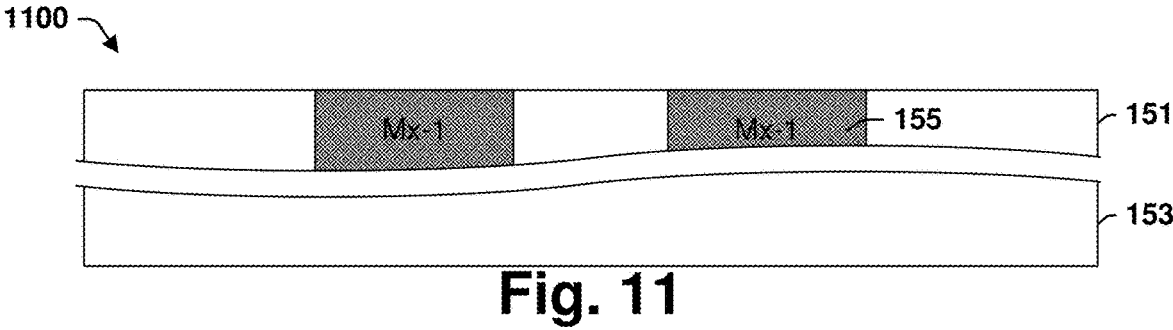
FIGS. 11-19 are a series of cross-sectional view illustrations exemplifying a method of forming an integrated chip such as the integrated chip of FIG. 1.

As shown in cross-sectional view 1100 of FIG. 11, one or more lower interconnects 155 are formed within a lower dielectric structure 151 formed over a substrate 153. In various embodiments, the substrate 153 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the one or more lower interconnects 155 may comprise one or more of a middle-of-line (MOL) interconnect, a conductive contact, an interconnect wire, and/or an interconnect via.

In some embodiments, the one or more lower interconnects 155 may be respectively formed using a damascene process (e.g., a single damascene process or a dual damascene process). In such embodiments, the one or more lower interconnects 155 may be respectively formed by one or more cycles that include forming an inter-level dielectric (ILD) layer, selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization (CMP) process) to remove excess of the conductive material from over the ILD layer.

Figure 12:
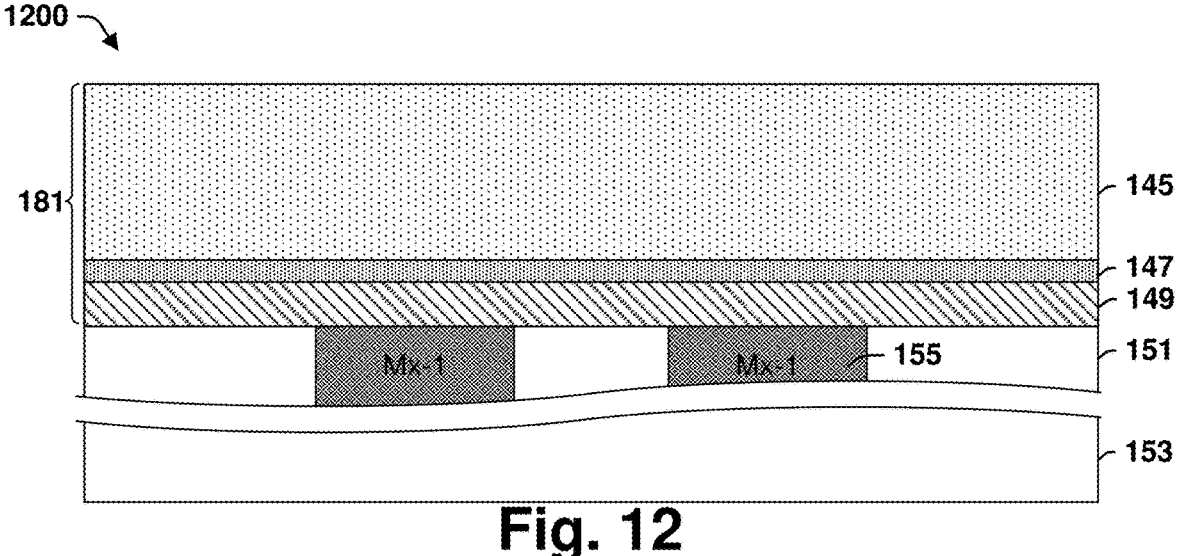

As shown in the cross-sectional view 1200 of FIG. 12, a dielectric structure 181 that includes an etch stop layer 149, a buffer layer 147, and a first ILD layer 145 is formed over the lower dielectric structure 151. The etch stop layer 149, the buffer layer 147, and the first ILD layer 145 may be formed by one or more deposition processes (e.g., a physical vapor deposition (PVD) process, a chemical vapor deposition (CVD) process, a plasma enhanced CVD (PE-CVD) process, an atomic layer deposition (ALD) process, or the like).

Figure 13:
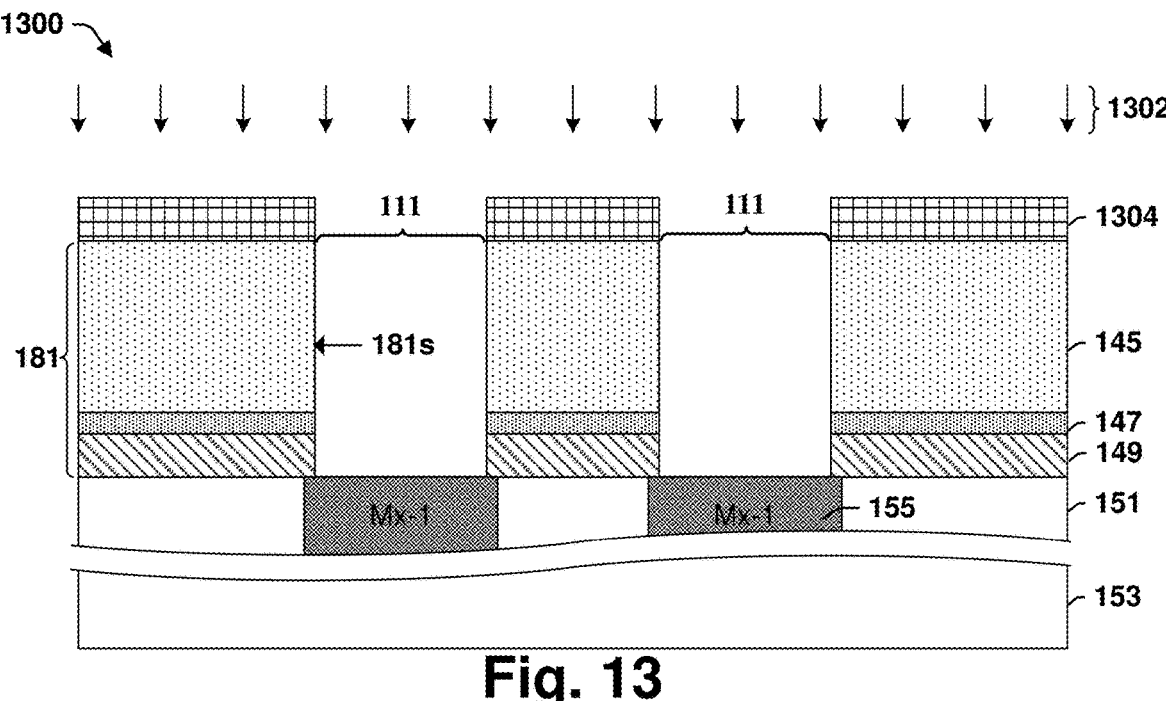

As shown in the cross-sectional view 1300 of FIG. 13, a mask 1304 is formed and a first etching process 1302 is carried out to pattern the dielectric structure 181. The mask 1304 may comprise a photosensitive material (e.g., photoresist), a hard mask, or the like. The first etching process 1302 forms sidewalls 181s in the dielectric structure 181. The sidewalls 181s define a plurality of openings 111 extending through the dielectric structure 181. In some embodiments, the openings 111 have a substantially square shape as viewed from a top-view. In some embodiments, the openings 111 have a substantially circular shape as viewed from a top-view. After the first etching process 1302 is complete, the mask 1304 may be stripped.

Figure 14:
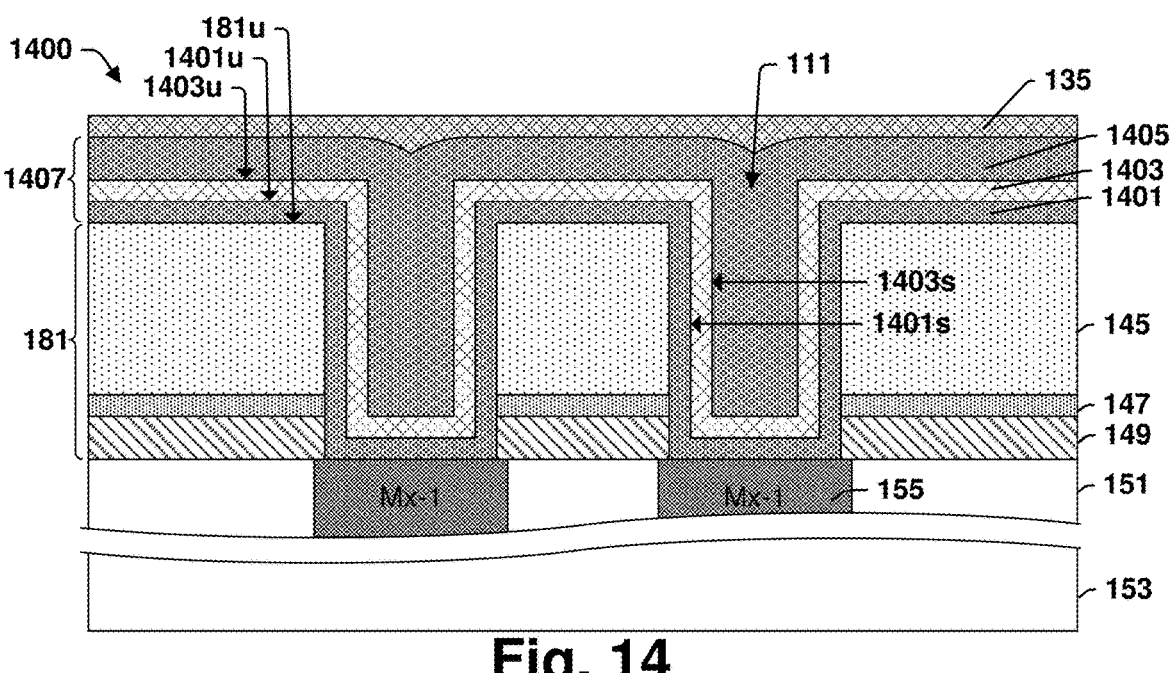

As shown in cross-sectional view 1400 of FIG. 14, a memory cell stack 1407 is formed over the first ILD layer 145 and within the plurality of openings 111. The memory cell stack 1407 may be formed by a plurality of deposition processes (e.g., a PVD process, a CVD process, a PE-CVD process, an ALD process, or the like). The memory cell stack 1407 includes at least a lower electrode layer 1401, a data storage layer 1403, and an upper electrode layer 1405. In some embodiments, the lower electrode layer 1401 is formed along the sidewalls 181s and the upper surface 181u of the dielectric structure 181. In some embodiments, the lower electrode layer 1401 is formed by ALD or the like. In some embodiments, the data storage layer 1403 is formed along inner sidewalls 1401s and an upper surface 1401u of the lower electrode layer 1401. In some embodiments, the data storage layer 1403 is formed by ALD or the like. In some embodiments, the upper electrode layer 1405 is formed along the sidewalls 1403s and an upper surface 1403u of the data storage layer 1403. In some embodiments, the upper electrode layer 1405 is formed by ALD or the like.

As further shown by the cross-sectional view 1400 of FIG. 14, the capping structure 135 may be formed over the memory cell stack 1407. The capping structure 135 may also be formed by one or more deposition processes.

Figure 15:
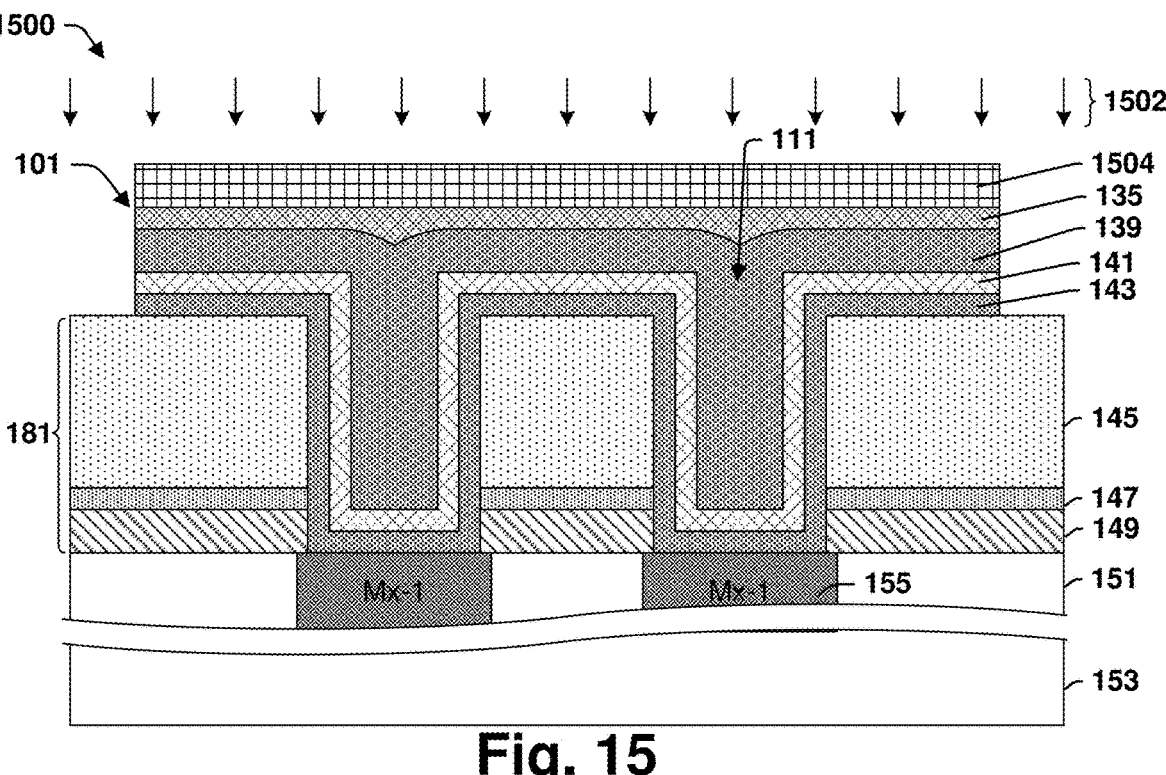

As shown in cross-sectional view 1500 of FIG. 15, a second mask 1504 may be formed and used in a second etching process 1502 that defines the memory cell 101 from the memory cell stack 1407. The second etching process 1502 defines the lower electrode 143 from the lower electrode layer 1401, the data storage layer 141 from the data storage layer 1403, and the upper electrode 139 from the upper electrode layer 1405. In some embodiments, the second etching process 1502 comprises one or more dry etching processes (e.g., reactive ion etching (RIE), a plasma etching, a combination thereof, or the like). After the second etching process 1502 is complete, the second mask 1504 may be stripped.

Figure 16:
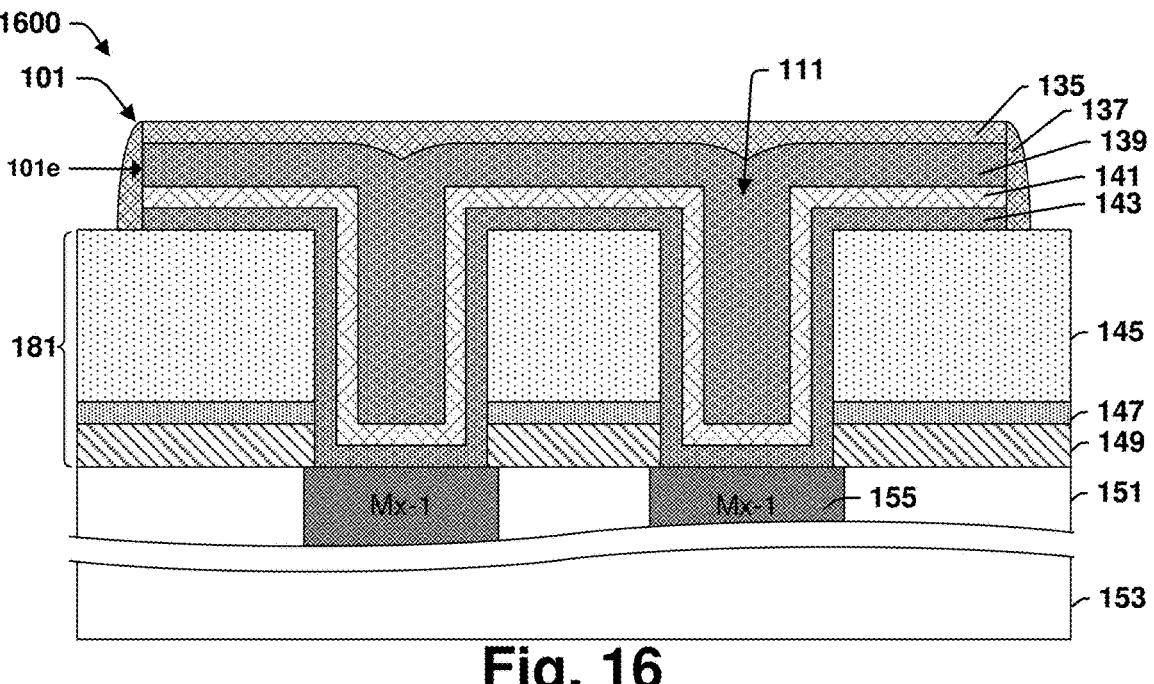

As shown in cross-sectional view 1600 of FIG. 16, the sidewall spacer 137 may be formed to cover the edges 101e of the memory cell 101. The sidewall spacer 137 may be formed by one or more deposition processes (e.g., a PVD process, a CVD process, a PE-CV process, or the like) followed by etching that removes the spacer material from horizontal surfaces.

Figure 17:
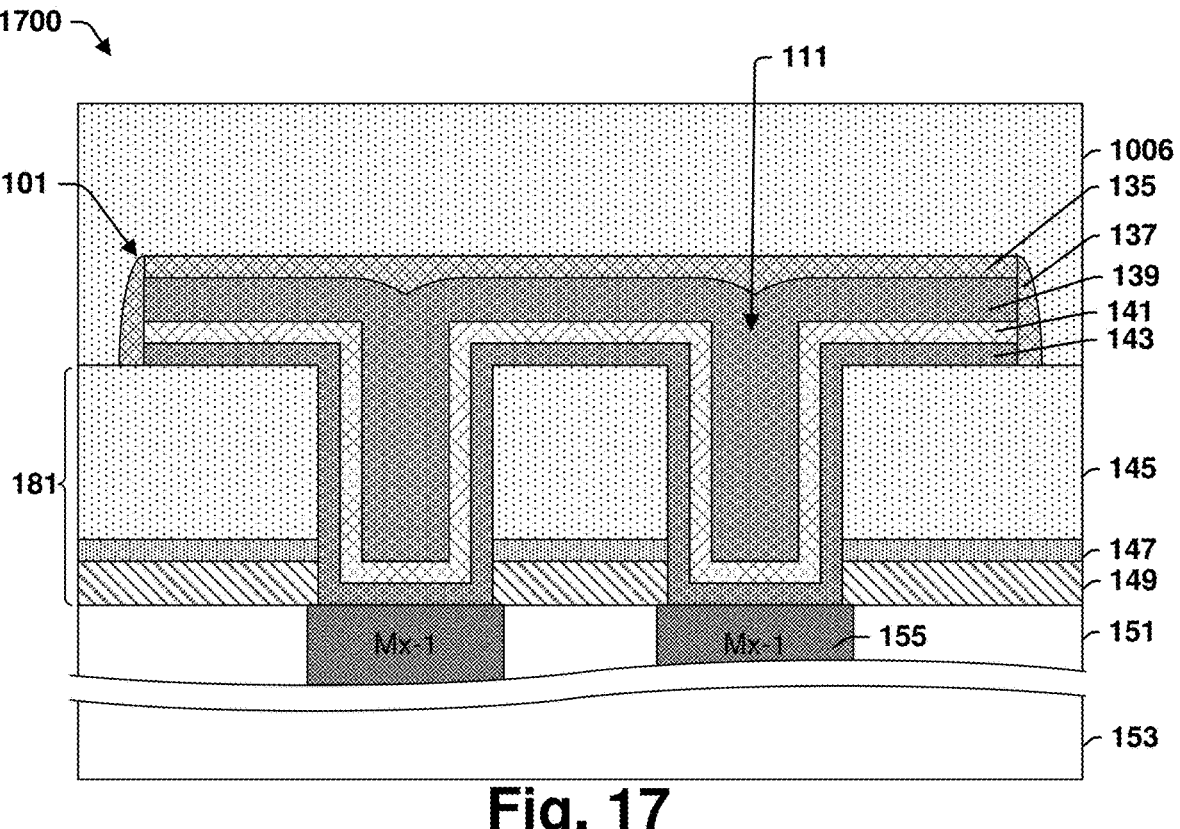

As shown in cross-sectional view 1700 of FIG. 17, the second ILD layer 1006 may be formed over the memory cell 101 and the first ILD layer 145. The second ILD layer 1701 may be formed by one or more deposition processes (e.g., a PVD process, a CVD process, a PE-CVD process, an ALD process, or the like).

Figure 18:
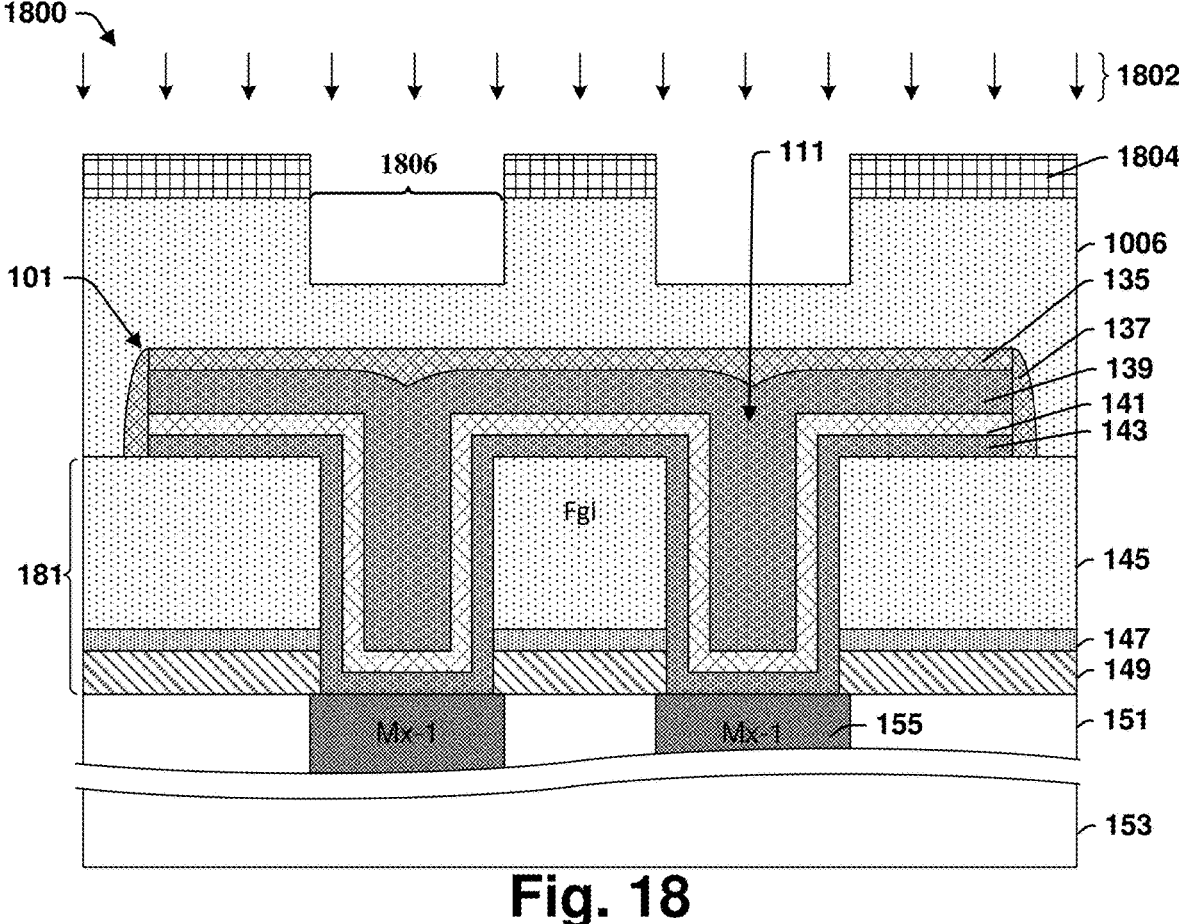
Figure 19:
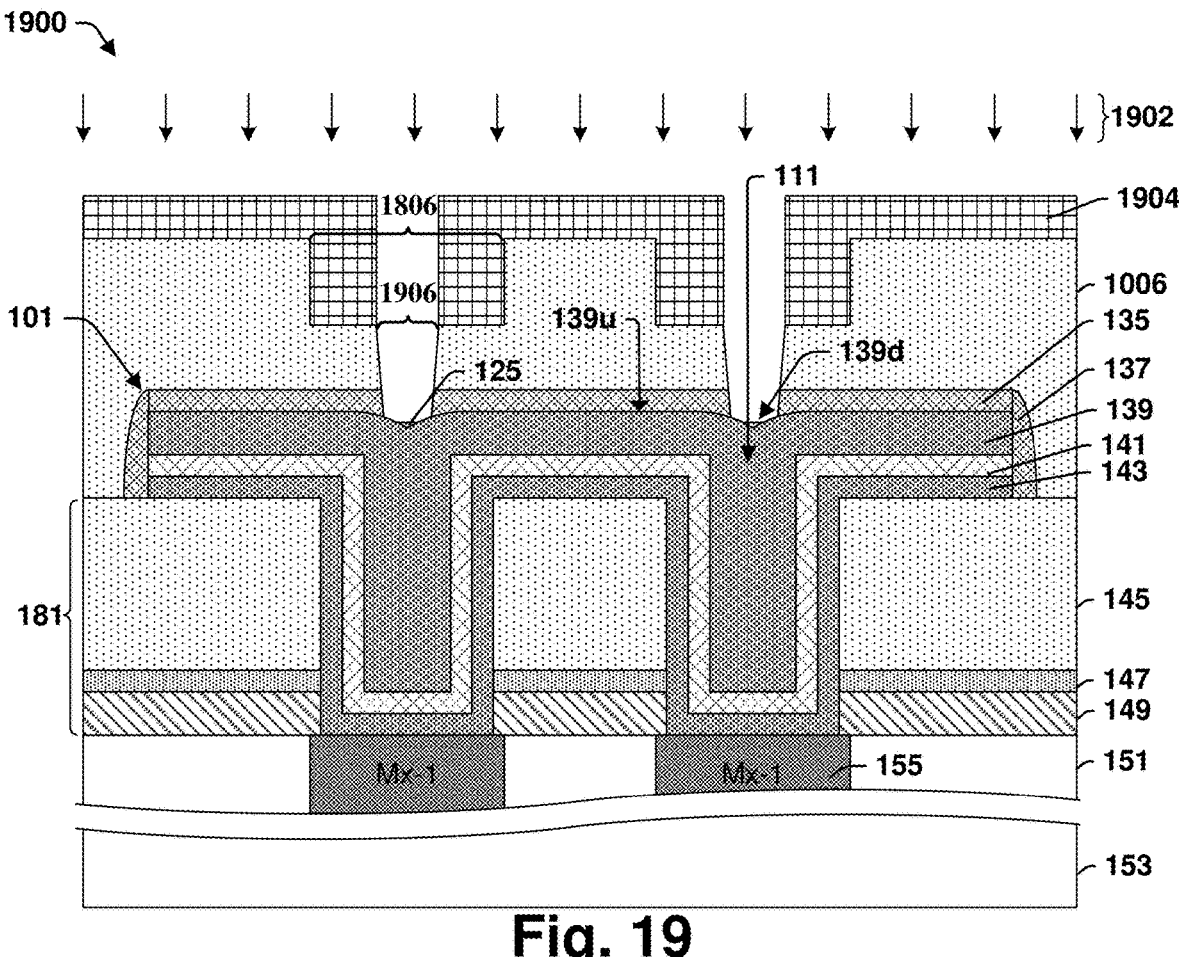

As shown in cross-sectional view 1800 of FIG. 18, a mask 1804 may be formed and a third etch process 1802 may be carried out to form trenches 1806 in the second ILD layer 1701. As shown in the cross-sectional view 1900 of FIG. 19, a mask 1904 may be formed and a fourth etch process 1902 may be carried out to form holes 1906 with the trenches 1806. The holes 1906 extend through the second ILD layer 1701 and through the capping structure 135 to expose the upper surface 139u of the upper electrode 139. Islands 125 of the capping structure 135 may remain at the bottoms of the holes 1906 particularly if the holes 1906 are formed directly over the depressions 139d in the upper surface 139u.

The mask 1904 may be stripped and the holes 1906 and the trenches 1806 filled with conductive material followed by planarization to produce a structure as shown in FIG. 1. The conductive material filling the holes 1906 provides the top electrode vias 123 and the conductive material filling the trenches 1806 provides wires MX. The conductive material may be formed by way of a deposition process and/or a plating process (e.g., electroplating, electro-less plating, or the like). The planarization process may be, for example, chemical mechanical polishing (CVD).

FIG. 20 provides a flow chart for a process 2000 that may be used to form an integrated chip having a memory cell according to the present disclosure. The process 2000 is illustrated and described as a series of acts or events, but it will be appreciated that the ordering of these acts and events may be varied. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The process 2000 may begin with act 2002, forming a lower interconnect within a lower dielectric structure over a substrate. The cross-sectional view 1100 of FIG. 11 provides an example. Forming the lower interconnect may comprising forming a plurality of via and metallization layers to produce structures of the type shown by the cross-sectional view 1000 of FIG. 10.

The process 2000 may continue with act 2004, forming a dielectric structure over the lower dielectric structure. The cross-sectional view 1200 of FIG. 12 provides an example. The dielectric structure is of the type that includes an ILD layer. In some embodiments, the ILD layer is a low-κ dielectric. In some embodiments, the dielectric structure includes an etch stop layer as its lowest layer. In some embodiments, the dielectric structure includes a buffer layer between the etch stop layer as the ILD layer.

Act 2006 is patterning the dielectric structure to form openings. In some embodiments, the lower interconnect is exposed through the openings. The cross-sectional view 1300 of FIG. 13 provides an example. In some embodiments, the openings are in a two dimensional pattern, the openings comprising at least three openings that are not in a line. FIGS. 2 through 9 provide examples that show some of the possible opening shapes and two-dimensional patterns.

Act 2008 is forming a memory cell stack over the dielectric structure and within the openings. The cross-sectional view 1400 of FIG. 14 provides an example. The memory cell stack includes at least a lower electrode layer, a data storage layer, and an upper electrode layer. Each of these layers may itself comprise a plurality of layers.

Act 2010 is forming a capping structure over the memory cell stack. The cross-sectional view 1400 of FIG. 14 provides an example. The capping structure may include one or more layers. The capping structure may provide a hard mask for etching the memory cell stack. The capping structure may provide a buffer layer between the upper electrode and the second ILD layer that will be formed over the memory cell. The capping structure may provide an etch stop that facilitates landing vias on the upper electrode.

Act 2012 is patterning the memory cell stack to define a memory cell. The cross-sectional view 1500 of FIG. 15 provides an example. The memory cell includes protrusions into the each of the openings.

Act 2014 is forming a sidewall spacer around the memory cell. The cross-sectional view 1600 of FIG. 16 provides an example. In some embodiments a height of the sidewall spacer equals a height of the memory cell stack. In some embodiments the edges of the various layers of the memory cell stack are aligned adjacent the sidewall spacer and abut the sidewall spacer. Optionally, the edges of the memory cell are treated to remove or passivate contaminants prior to forming the sidewall spacer. Optionally, the memory cell includes a plurality of sidewall spacers. Optionally, some of the sidewall spacers are formed before patterning the of the memory cell stack is completed and optionally the edges are not aligned.

Act 2016 is forming a second ILD layer over the memory cell. The cross-sectional view 1700 of FIG. 17 provides an example. The second ILD layer may have the same composition as the first ILD layer whereby the two layers appear to be one continuous layer.

Act 2018 is forming top electrode vias that extend through the second ILD layer to contact the upper electrode. The cross-sectional view 1800 of FIG. 18, the cross-sectional view 1900 of FIG. 19, and FIG. 1 combine to provide an example. In some embodiments, the top electrode vias are in a two-dimensional pattern. In some embodiments, the top electrode vias are formed over the openings. In some embodiments, an island of the capping structure is trapped between one of the top electrode vias and the upper electrode. In some embodiments, at least some of the top electrode vias are offset from the openings. In some embodiments, there are more top electrode vias than there are openings. In some embodiments, there are fewer top electrode vias than there are openings. FIGS. 1 through 9 provide examples that show some of the possible arrangements for the top electrode vias.

Some aspects of the present disclosure relate to an integrated chip having a substrate, a lower dielectric structure over the substrate, an interconnect within the lower dielectric structure, an etch stop layer over the lower dielectric structure, an inter-level dielectric layer over the etch stop layer, and a memory cell comprising a lower electrode, a data storage layer, and an upper electrode disposed over and within one or more openings that extend through the inter-level dielectric layer and the etch stop layer. Each of the lower electrode, the data storage layer, and the upper electrode extends into the one or more openings and over the inter-level dielectric layer lateral to the one or more openings. In some embodiments, there are three or more of the openings are they are a two-dimensional arrangement. In some embodiments, there is an array of openings corresponding to the memory cell. In some embodiments, the memory cell is a ferroelectric memory cell. In some embodiments, the lower electrode makes direct contact with the interconnect. In some embodiments, a depth of the one or more openings is greater than or equal to a width of the one or more openings.

Some aspects of the present disclosure relate to an integrated chip that includes a substrate, a metal interconnect over the substrate, and a dielectric structure over the metallization layer. The metal interconnect includes a metallization layer. Three or more openings disposed in a two-dimensional arrangement extend through the dielectric structure. A memory cell comprising a lower electrode, a data storage layer, and an upper electrode is disposed over the dielectric structure and within each of the three or more openings. Each of the lower electrode, the data storage layer, and the upper electrode descend into the three or more openings and over the dielectric structure lateral to the three or more openings. In some embodiments, there are a plurality of top electrode vias in direct contact with the upper electrode. In some embodiments, an island of a dielectric material is trapped between the upper electrode and a top electrode via for the memory cell. In some embodiments, the top electrode via is horizontally offset from each of the three or more openings. In some embodiments, the three or more openings are directly over two or more wires in the metallization layer. In some embodiments, a depth of the three or more openings is greater than or equal to a distance from a top of the one or more openings to an overlying metallization layer.

Some aspects of the present disclosure relate to a method of forming an integrated ship. The method includes forming a lower interconnect within a lower dielectric structure over a substrate, forming an etch stop layer over the lower dielectric structure, forming an inter-level dielectric layer over the etch stop layer, etching a plurality of openings through the inter-level dielectric layer, forming a memory cell stack over the inter-level dielectric layer and in the openings, and etching to define a memory cell from the memory cell stack. An upper electrode of the memory cell descends into each of the openings. A portion of the memory cell extends laterally from the openings over the inter-level dielectric layer. In some embodiments, the openings extend through the etch stop layer. In some embodiments, the method further comprises forming a plurality of top electrode vias each of which contacts the upper electrode The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a lower interconnect within a lower dielectric structure over a substrate;

forming an etch stop layer over the lower dielectric structure;

forming an inter-level dielectric layer over the etch stop layer;

etching a first opening and a second opening through the inter-level dielectric layer;

forming a memory cell stack over the inter-level dielectric layer and in the first and second openings; and etching to define a memory cell from the memory cell stack;

wherein an upper electrode of the memory cell descends into each of the first and second openings; and a lower electrode of the memory cell extends laterally from the first opening to the second opening over the inter-level dielectric layer.

2. The method of claim 1, wherein the first and second openings extend through the etch stop layer.

3. The method of claim 1, wherein the first and second openings are in a two-dimensional pattern with a third and fourth opening, and the memory cell extends over and in the first, second, third, and fourth openings.

4. The method of claim 1, wherein the memory cell is a ferroelectric random access memory cell.

5. The method of claim 1, further comprising forming a plurality of top electrode vias each of which contacts the upper electrode.

6. A method of forming a memory device, the method comprising:

forming a first dielectric structure over a metallization layer of a BEOL interconnect structure disposed on a substrate, the first dielectric structure comprising an inter-level dielectric (ILD) layer;

etching a plurality of openings through the first dielectric structure;

forming a memory cell stack over the plurality of openings, the memory cell stack comprising a lower electrode layer, a data storage layer, and an upper electrode layer, wherein the lower electrode layer and the data storage layer line the plurality of openings, and a portion of the memory cell stack is lateral to the plurality of openings; and forming a mask that extends over the plurality of openings and etching the memory cell stack to define a memory cell that extends over and into the plurality of openings.

7. The method of claim 6, wherein the plurality of openings comprise two or more openings.

8. The method of claim 6, wherein the plurality of openings are rectangular.

9. The method of claim 6, wherein the plurality of openings are circular.

10. The method of claim 6, wherein the plurality of openings are oblong.

11. The method of claim 6, further comprising forming a sidewall spacer that surrounds the memory cell, wherein the sidewall spacer contacts the lower electrode layer, data storage layer, and upper electrode layer.

12. The method of claim 6, wherein a depth of the plurality of openings is greater than a width of each of the openings.

13. A method, comprising:

forming a first dielectric structure over a metallization layer in a BEOL interconnect structure disposed over a substrate, the first dielectric structure comprising an inter-level dielectric (ILD) layer and an etch stop layer;

patterning a plurality of openings in the first dielectric structure;

depositing a memory cell stack comprising a lower electrode layer, a data storage layer, and an upper electrode layer such that the lower electrode layer, the data storage layer, and the upper electrode layer extend into the plurality of openings;

patterning the memory cell stack to define a memory cell that extends over and into the plurality of openings; and forming an upper electrode via that contacts the upper electrode layer.

14. The method of claim 13, wherein forming the upper electrode via comprises forming a plurality of upper electrode vias that contact the upper electrode layer.

15. The method of claim 14, wherein the upper electrode vias are laterally offset from the openings.

16. The method of claim 14, wherein the number of upper electrode vias is distinct from the number of openings.

17. The method of claim 14, wherein the lower electrode layer, the data storage layer, and the upper electrode layer are deposited by atomic layer deposition.

18. The method of claim 14, wherein the lower electrode layer directly contacts a wire in the metallization layer.

19. The method of claim 14, wherein the lower electrode layer contacts a plurality of wires in the metallization layer.

20. The method of claim 14, wherein the plurality of openings extend into the etch stop layer beneath the ILD layer.

* * * * *